US010454070B2

(12) United States Patent
Sakamoto

(10) Patent No.: US 10,454,070 B2
(45) Date of Patent: Oct. 22, 2019

(54) ORGANIC EL ELEMENT, ORGANIC EL DISPLAY PANEL, AND METHOD OF MANUFACTURING ORGANIC EL DISPLAY PANEL

(71) Applicant: JOLED INC., Tokyo (JP)

(72) Inventor: Koyo Sakamoto, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/030,389

(22) Filed: Jul. 9, 2018

(65) Prior Publication Data

US 2019/0019989 A1 Jan. 17, 2019

(30) Foreign Application Priority Data

Jul. 12, 2017 (JP) .................................. 2017-136370

(51) Int. Cl.
*H01L 51/52* (2006.01)
*H01L 27/32* (2006.01)
*H01L 51/50* (2006.01)
*H01L 51/56* (2006.01)
*H01L 51/00* (2006.01)

(52) U.S. Cl.
CPC ...... *H01L 51/5265* (2013.01); *H01L 27/3244* (2013.01); *H01L 51/5072* (2013.01); *H01L 51/5092* (2013.01); *H01L 51/5218* (2013.01); *H01L 51/5225* (2013.01); *H01L 51/5234* (2013.01); *H01L 51/56* (2013.01); *H01L 2251/301* (2013.01); *H01L 2251/308* (2013.01); *H01L 2251/5315* (2013.01); *H01L 2251/558* (2013.01)

(58) Field of Classification Search
CPC ............. H01L 51/5265; H01L 51/5072; H01L 51/5092; H01L 51/5218; H01L 51/5225; H01L 51/5234; H01L 51/56; H01L 27/3244
USPC .................. 257/40, 43, 88, 98, 99, E33.067, 257/E51.018, E51.022; 438/104; 315/504, 506
See application file for complete search history.

(56) References Cited

U.S. PATENT DOCUMENTS

| 9,012,897 B2 * | 4/2015 | Harada | H01L 27/3246 257/40 |
| 2010/0051973 A1 * | 3/2010 | Kobayashi | H01L 51/56 257/88 |
| 2010/0090592 A1 | 4/2010 | Shiobara et al. | |
| 2010/0327297 A1 * | 12/2010 | Yoshida | H01L 27/3211 257/89 |

(Continued)

FOREIGN PATENT DOCUMENTS

JP 2013-214359 A 10/2013
JP 2014-140048 A 7/2014

(Continued)

*Primary Examiner* — Dao H Nguyen
(74) *Attorney, Agent, or Firm* — Chip Law Group

(57) ABSTRACT

Disclosed herein is an organic EL element including a first electrode, a light emitting layer, a ground layer, and a light-transmitting second electrode stacked in this order over a substrate. The ground layer is light-transmitting and electrically conductive, and its surface on which the second electrode is stacked has a surface roughness of 0.3 to 2.7 nm. The second electrode is a silver thin film layer formed of silver or containing silver as a main constituent.

18 Claims, 16 Drawing Sheets

(56) References Cited

U.S. PATENT DOCUMENTS

| | | | |
|---|---|---|---|
| 2011/0198623 A1* | 8/2011 | Matsushima | H01L 27/3246 257/88 |
| 2013/0240854 A1* | 9/2013 | Sugano | H01L 51/5203 257/40 |
| 2015/0303398 A1 | 10/2015 | Hiromoto, II | |
| 2016/0133677 A1* | 5/2016 | Yamamoto | H01L 27/3246 257/40 |

FOREIGN PATENT DOCUMENTS

| | | |
|---|---|---|
| JP | 2014-157821 A | 8/2014 |
| JP | 2015-138765 A | 7/2015 |
| JP | 2016-091841 A | 5/2016 |
| WO | 2012/176407 A1 | 12/2012 |
| WO | 2014/077063 A1 | 5/2014 |

* cited by examiner

F I G. 4

| ETL (30nm) | | | Ag (15nm) | | |
|---|---|---|---|---|---|
| FILM FORMING RATE [Å/s] | SUBSTRATE TEMPERATURE [°C] | SURFACE ROUGHNESS Ra [nm] | SHEET RESISTANCE [Ω/□] | SURFACE ROUGHNESS Ra [nm] | EVALUATION |
| 0.2 | 25 | 0.2 | 10.3 | 3.9 | × |
| 0.5 | 25 | 0.3 | 6.2 | 2.0 | ○ |
| 1.0 | 25 | 0.5 | 4.4 | 1.5 | ○ |
| 1.5 | 25 | 0.8 | 3.1 | 1.1 | ○ |
| 2.5 | 25 | 1.3 | 2.9 | 1.5 | ○ |
| 5.0 | 25 | 2.7 | 2.7 | 2.9 | ○ |
| 7.5 | 25 | 3.3 | 2.5 | 3.7 | × |

FIG. 7

| ETL (30nm) | | | Ag (10nm) | | |
| --- | --- | --- | --- | --- | --- |
| FILM FORMING RATE [Å/s] | SUBSTRATE TEMPERATURE [°C] | SURFACE ROUGHNESS Ra [nm] | SHEET RESISTANCE [Ω/□] | SURFACE ROUGHNESS Ra [nm] | EVALUATION |
| 0.2 | 25 | 0.2 | 13.6 | 4.5 | × |
| 0.5 | 25 | 0.3 | 8.5 | 2.4 | ○ |
| 1.5 | 25 | 0.8 | 4.3 | 1.3 | ○ |
| 5.0 | 25 | 2.7 | 3.8 | 2.8 | ○ |
| 7.5 | 25 | 3.3 | 3.5 | 3.5 | × |

FIG. 8

| ETL (30nm) | | | Ag (20nm) | | |
| --- | --- | --- | --- | --- | --- |
| FILM FORMING RATE [Å/s] | SUBSTRATE TEMPERATURE [°C] | SURFACE ROUGHNESS Ra [nm] | SHEET RESISTANCE [Ω/□] | SURFACE ROUGHNESS Ra [nm] | EVALUATION |
| 0.2 | 25 | 0.2 | 9.3 | 3.5 | × |
| 0.5 | 25 | 0.3 | 5.0 | 1.8 | ○ |
| 1.5 | 25 | 0.8 | 2.5 | 1.0 | ○ |
| 5.0 | 25 | 2.7 | 2.2 | 3.2 | ○ |
| 7.5 | 25 | 3.3 | 2.0 | 3.9 | × |

F I G. 14

| ETL (30nm) | | | | Ag (15nm) | | | |
|---|---|---|---|---|---|---|---|
| FILM FORMING RATE [Å/s] | SUBSTRATE TEMPERATURE [°C] | UV OZONE TREATMENT [sec] | SURFACE FREE ENERGY [mJ/m²] | SHEET RESISTANCE [Ω/□] | SURFACE ROUGHNESS Ra [nm] | ADHESION OF FOREIGN MATTER | EVALUATION |
| 0.2 | 25 | 0 | 25 | 10.3 | 3.9 | ○ | × |
| 0.2 | 25 | 1 | 33 | 4.4 | 1.7 | ○ | ○ |
| 0.2 | 25 | 2 | 56 | 3.6 | 1.3 | ○ | ○ |
| 0.2 | 25 | 5 | 97 | 3.0 | 1.0 | ○ | ○ |
| 0.2 | 25 | 10 | 150 | 2.5 | 0.6 | × | × |

FIG. 15

| ETL (30nm) | | | | Ag (10nm) | | | |
|---|---|---|---|---|---|---|---|
| FILM FORMING RATE [Å/s] | SUBSTRATE TEMPERATURE [°C] | UV OZONE TREATMENT [sec] | SURFACE FREE ENERGY [mJ/m²] | SHEET RESISTANCE [Ω/□] | SURFACE ROUGHNESS Ra [nm] | ADHESION OF FOREIGN MATTER | EVALUATION |
| 0.2 | 25 | 0 | 25 | 13.6 | 4.5 | ○ | × |
| 0.2 | 25 | 1 | 33 | 5.8 | 2.1 | ○ | ○ |
| 0.2 | 25 | 5 | 97 | 4.0 | 1.5 | ○ | ○ |
| 0.2 | 25 | 10 | 150 | 3.3 | 1.1 | × | × |

FIG. 16

| | ETL (30nm) | | | Ag (20nm) | | | |
|---|---|---|---|---|---|---|---|
| FILM FORMING RATE [Å/s] | SUBSTRATE TEMPERATURE [°C] | UV OZONE TREATMENT [sec] | SURFACE FREE ENERGY [mJ/m²] | SHEET RESISTANCE [Ω/□] | SURFACE ROUGHNESS Ra [nm] | ADHESION OF FOREIGN MATTER | EVALUATION |
| 0.2 | 25 | 0 | 25 | 9.3 | 3.5 | ○ | × |
| 0.2 | 25 | 1 | 33 | 4.0 | 1.5 | ○ | ○ |
| 0.2 | 25 | 5 | 97 | 2.7 | 0.8 | ○ | ○ |
| 0.2 | 25 | 10 | 150 | 2.2 | 0.5 | × | × |

FIG. 17

| | ETL (30nm) | | | Ag (15nm) | |
|---|---|---|---|---|---|
| FILM FORMING RATE [Å/s] | SUBSTRATE TEMPERATURE [°C] | SURFACE ROUGHNESS Ra [nm] | SHEET RESISTANCE [Ω/□] | SURFACE ROUGHNESS Ra [nm] | EVALUATION |
| 1.5 | 25 | 0.8 | 3.1 | 1.1 | ○ |
| 1.5 | 80 | 0.5 | 4.2 | 1.4 | ○ |
| 1.5 | 150 | 0.3 | 5.9 | 1.9 | ○ |
| 1.5 | 300 | 0.2 | 9.9 | 3.7 | × |

ORGANIC EL ELEMENT, ORGANIC EL DISPLAY PANEL, AND METHOD OF MANUFACTURING ORGANIC EL DISPLAY PANEL

CROSS-REFERENCE TO RELATED APPLICATION

This application claims priority benefit of Japanese Patent Application No. JP 2017-136370 filed in the Japan Patent Office on Jul. 12, 2017. Each of the above-referenced applications is hereby incorporated herein by reference in its entirety.

BACKGROUND

The present disclosure relates to an organic EL element, an organic EL display panel, and a method of manufacturing an organic EL display panel.

In general, an organic EL (Electro-Luminescence) display panel has a configuration in which a light emitting layer is disposed between an anode and a cathode. In such an organic EL display panel, at least one of the anode and the cathode is a light-transmitting electrode through which visible light is transmitted, for taking out the light from the light emitting layer.

For example, in a so-called top emission type organic EL display panel, an electrode on the substrate side is a light-reflective electrode which reflects visible light, whereas an electrode on the opposite side is a light-transmitting electrode, and, by this configuration, light take-out efficiency is enhanced.

The light-reflective electrode is formed by use of, for example, silver (Ag) or aluminum (Al), whereas the light-transmitting electrode is formed by use of, for example, a metallic oxide such as ITO (Indium Tin Oxide) or IZO (Indium Zinc Oxide) (see, for example, Japanese Patent Laid-open No. 2014-140048).

In the electrode formed by use of a light-transmitting material (hereinafter referred to as "light-transmitting electrode"), it is demanded to realize both a low resistance and a high transmittance. For this reason, in addition to the above-mentioned metallic oxide, use of a metal thin film has been investigated. In the light-transmitting electrode, uniformity of film properties is demanded, for further efficient transmission of light and for stabilization of characteristics such as resistivity. Therefore, the light-transmitting electrode is formed by vapor deposition, a sputtering method or the like.

SUMMARY

There is a need for an organic EL element and an organic EL display panel in which uniformity of film properties at the time of forming a metallic thin film of silver as a light-transmitting electrode is enhanced, and a method of manufacturing them.

In accordance with one mode of the present disclosure, there is provided an organic EL element including a first electrode, a light emitting layer, a ground layer, and a light-transmitting second electrode stacked in this order over a substrate, in which the ground layer is light-transmitting and electrically conductive, and its surface on which the second electrode is stacked has a surface roughness Ra of 0.3 to 2.7 nm, and the second electrode is a silver thin film layer formed of silver or containing silver as a main constituent.

In accordance with another mode of the present disclosure, there is provided an organic EL element including a first electrode, a light emitting layer, a ground layer, and a light-transmitting second electrode stacked in this order over a substrate, in which the ground layer is light-transmitting and electrically conductive, and its surface on which the second electrode is stacked has a surface free energy of 33 to 97 mJ/m2, and the second electrode is a silver thin film layer formed of silver or containing silver as a main constituent.

According to the organic EL elements in the described modes, homogeneity of the silver thin film layer of the light-transmitting electrode is enhanced. Therefore, light take-out efficiency of the light-transmitting electrode is enhanced, and a region where a driving voltage for the organic EL element is lowered due to electric resistance of the light-transmitting electrode is restrained from being generated in an organic EL display panel.

BRIEF DESCRIPTION OF THE DRAWINGS

FIG. 4 is a table depicting influences exerted on film properties of an upper electrode when film forming rate is varied and the surface roughness of an electron transport layer as a ground layer is varied, in the case where the film thickness of the upper electrode is set to 15 nm;

FIG. 7 is a table depicting influences exerted on film properties of an upper electrode when film forming rate is varied and the surface roughness of an electron transport layer as a ground layer is varied, in the case where the film thickness of the upper electrode is set to 10 nm;

FIG. 8 is a table depicting influences exerted on film properties of an upper electrode when film forming rate is varied and the surface roughness of an electron transport layer as a ground layer is varied, in the case where the film thickness of the upper electrode is set to 20 nm;

FIGS. 9A, 9B, 9C, 9D, 9E and 9F are partial sectional views schematically depicting a part of a manufacturing process of an organic EL display panel according to one embodiment, in which FIG. 9A is a partial sectional view depicting a state in which a TFT (Thin Film Transistor) layer is formed on a base material, FIG. 9B is a partial sectional view depicting a state in which an interlayer insulating layer is formed on the TFT layer, FIG. 9C is a partial sectional view depicting a state in which a barrier metal material layer is formed on the interlayer insulating layer, FIG. 9D is a partial sectional view depicting a state in which a lower electrode layer is formed on the barrier metal material layer, FIG. 9E is a partial sectional view depicting a state in which a hole injection material layer is formed on the lower electrode layer, and FIG. 9F is a partial sectional view depicting a state in which the barrier metal material layer, the lower electrode material layer, and the hole injection material layer are patterned to form lower electrodes and a hole injection layers;

FIGS. 10A, 10B, 10C and 10D are partial sectional views schematically depicting a part of the manufacturing process of the organic EL display panel according to the embodiment, in which FIG. 10A is a partial sectional view depicting a state in which a partition wall material layer is formed on the hole injection layers and the interlayer insulating layer, FIG. 10B is a partial sectional view depicting a state in which the partition wall material layer is patterned to form partition wall layers, FIG. 10C is a partial sectional view depicting a state in which hole transport layers are formed in openings in the partition wall layer, and FIG. 10D is a partial sectional view depicting a state in which light emitting layers are formed on the hole transport layers in the openings in the partition wall layer;

FIGS. 11A, 11B and 11C are partial sectional views schematically depicting a part of the manufacturing process of the organic EL display panel according to the embodiment, in which FIG. 11A is a partial sectional view depicting a state in which an electron transport layer is formed on the partition wall layer and the light emitting layers, FIG. 11B is a partial sectional view depicting a state in which an upper electrode is formed on the electron transport layer, and FIG. 11C is a partial sectional view depicting a state in which a sealing layer is formed on the upper electrode;

FIG. 14 is a table depicting influences exerted on film properties of an upper electrode when a surface of an electron transport layer as a ground layer is subjected to a UV (Ultraviolet) ozone treatment to vary the surface free energy, in the case where the film thickness of the upper electrode is set to 15 nm;

FIG. 15 is a table depicting influences exerted on film properties of the upper electrode when the surface of the electron transport layer as a ground layer is subjected to the UV ozone treatment to vary the surface free energy, in the case where the film thickness of the upper electrode is set to 10 nm;

FIG. 16 is a table depicting influences exerted on film properties of the upper electrode when the surface of the electron transport layer as a ground layer is subjected to the UV ozone treatment to vary the surface free energy, in the case where the film thickness of the upper electrode is set to 20 nm;

FIG. 17 is a table depicting influences exerted on film properties of the upper electrode when the substrate temperature is varied and the surface roughness of the electron transport layer as a ground layer is varied;

DETAILED DESCRIPTION OF THE PREFERRED EMBODIMENTS

<How One Mode of the Present Disclosure has been Reached>

A light-transmitting electrode of an organic EL display panel is required to have a high transmittance of visible light and a low electric resistance. For enhancing light take-out efficiency, it is preferable for light-transmitting electrode to have a high visible light transmittance. On the other hand, when the organic EL display panel is enlarged in size, the driving voltage may vary from element to element due to a voltage drop arising from the electric resistance (hereinafter referred to as "sheet resistance") of the electrode in a direction along the panel, and, therefore, it is preferable that the sheet resistance of the electrode is low. In view of this, as a method for reducing the sheet resistance of the light-transmitting electrode, use of a thin film of silver (Ag), which has high electrical conductivity, as the light-transmitting electrode has been investigated.

Figure 2A:
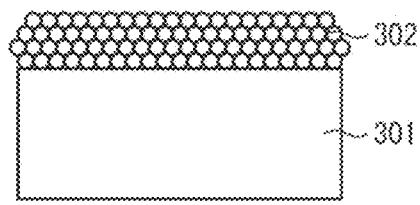
FIG. 2A schematically depicts a layer-formed growth mode in film formation, and FIG. 2B schematically depicts an island-formed growth mode in the film formation.

For forming a homogeneous thin film of silver, it is desirable that a film 302 of silver atoms is formed in a layer form on a surface of a to-be-overlaid body 301, as depicted in FIG. 2A (layer-formed shape mode).

However, for using a thin film of silver as the light-transmitting electrode, the film thickness should be approximately 10 to 20 nm. If the film thickness of the silver thin film layer is less than 10 nm, even when silver is formed in a layer form the sheet resistance thereof would be greater as compared to the case where ITO or IZO is used; therefore, the film thickness is desirably not less than 10 nm. On the other hand, if the upper limit of the film thickness of the silver thin film layer exceeds 20 nm, even when silver is formed in a layer form the visible light transmittance thereof would be deteriorated as compared to the case where ITO or IZO is used; therefore, the film thickness is desirably not more than 20 nm.

Figure 2B:
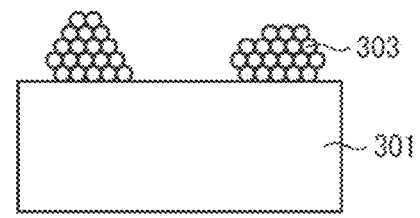

Hitherto, in the case of forming a thin film of silver as a light-transmitting electrode, a phenomenon in which an island-formed growth mode, in which island-formed lumps (hereinafter referred to "islands") 303 of silver atoms are formed on the surface of the to-be-overlaid body 301 as depicted in FIG. 2B, is brought about with the result of formation of a heterogeneous silver thin film has been generated (island formation phenomenon).

Figure 3:
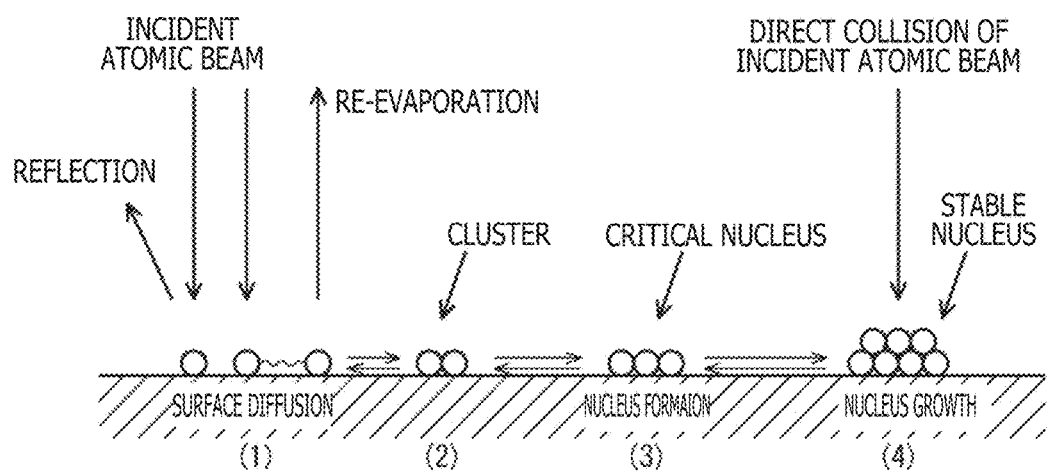
FIG. 3 schematically depicts a formation process in the island-formed growth mode.

FIG. 3 schematically depicts the principle of generation of the island formation phenomenon in stacking silver by a sputtering method, for example, in which an island is grown from the left side toward the right side in the figure.

(1) Of atoms incident on the to-be-overlaid body 301 such as a substrate, part is reflected, and another part is adsorbed. While the adsorbed atoms are moving on the surface of the to-be-overlaid body 301, part thereof is re-evaporated.

(2) The atoms adsorbed on the surface and moving on the surface collide on one another to form double particles, and further grow into clusters which are each a bound body of a plurality of the double particles.

(3) The atoms incident on the substrate and moving on the substrate surface come into and out of the cluster, so that the cluster may be dispersed and dissipated or may be grown to be larger. When the cluster is grown to be larger, a critical nucleus is formed.

(4) The atoms of incident atomic beams collide on the critical nucleus, which is grown to be larger to become a stable nucleus, whereby an island is formed.

Such an island formation phenomenon is generated particularly when it is intended to form a silver thin film having a film thickness of not more than 50 nm.

Therefore, the surface of the thin film has a multiplicity of projections due to the islands and a multiplicity of recesses corresponding to the parts between the islands, and, thus, local variability in film thickness is generated. Therefore, visible light transmittance and reflectance are both lowered, and heterogeneity in sheet resistance is generated.

In addition, since the size of the islands is coarse in relation to the film thickness of the silver thin film, there is a difference in electric resistivity between the inside of island (the inside of crystal) and the outside of island (grain boundary), so that electrical conductivity is not uniform in the silver thin film. Therefore, on one hand, sheet resistance in islands is low due to a low electric resistivity and a large film thickness, and, on the other hand, sheet resistance in the parts between islands is higher due to a high electric resistivity and a small film thickness. For this reason, local variability in sheet resistance of the silver thin film is large, and, when the silver thin film is used as an electrode, variability in driving voltage is generated among a plurality of organic EL elements. Besides, since a phenomenon in which plasmons are locally present on the surfaces of the islands is generated, absorption of visible light due to the plasmon (plasmon absorption) is generated, and light transmittance may be markedly lowered at a specific wavelength of visible light.

In order to cope with these problems, the present inventor considered that the island formation phenomenon arises from a large moving amount of the silver atoms adsorbed on the to-be-overlaid body 301, and has come to get an idea of controlling the state of the to-be-overlaid surface in such a manner as to restrict the moving amount of the silver atoms.

Modes of Disclosure

An organic EL element according to one mode of the present disclosure is an organic EL element including a first electrode, a light emitting layer, a ground layer, and a light-transmitting second electrode stacked in this order over a substrate, in which the ground layer is light-transmitting and electrically conductive, and its surface on which the second electrode is stacked has a surface roughness Ra of 0.3 to 2.7 nm, and the second electrode is a silver thin film layer formed of silver or containing silver as a main constituent.

In addition, an organic EL element according to one mode of the present disclosure is an organic EL element including a first electrode, a light emitting layer, a ground layer, and a light-transmitting second electrode stacked in this order over a substrate, in which the ground layer is light-transmitting and electrically conductive, and its surface on which the second electrode is stacked has a surface free energy of 33 to 97 mJ/m2, and the second electrode is a silver thin film layer formed of silver or containing silver as a main constituent.

According to the organic EL elements in the above modes, homogeneity of the silver thin film layer of the second electrode which is a light-transmitting electrode is enhanced. Therefore, efficiency of take-out of light from the second electrode is enhanced, and, in an organic EL display panel, generation of a region in which driving voltage for the organic EL element is lowered due to electric resistance of the second electrode can be restrained.

Here, the film thickness of the silver thin film layer is desirably 10 to 20 nm.

By this, light transmittance of the second electrode can be enhanced, and a high light take-out efficiency can be realized.

In addition, the ground layer may be an organic layer.

Besides, the second electrode may be a cathode, and the ground layer may be an electron injection layer or an electron transport layer.

The material for the ground layer may be selected from ITO and IZO.

Here, a region surrounded by a surface on the light emitting layer side of the first electrode and an interface between the ground layer and the second electrode may constitute an optical resonator having the surface and the interface as reflective surfaces.

As a result of this, the light take-out efficiency can be further enhanced by the optical resonator.

In addition, an organic EL display panel according to one mode of the present disclosure may include the organic EL element according to any one of the modes of the present disclosure.

Besides, according to one mode of the present disclosure, there is provided a method of manufacturing an organic EL display panel, the method including stacking a first electrode, a light emitting layer, a ground layer, and a light-transmitting second electrode in this order over a substrate, in which the ground layer is formed from a light-transmitting and electrically conductive material, and its surface on which the second electrode is stacked has a surface roughness Ra of 0.3 to 2.7 nm, and the second electrode includes a silver thin film layer formed of silver or containing silver as a main constituent.

In addition, according to one mode of the present disclosure, there is provided a method of manufacturing an organic EL display panel, the method including stacking a first electrode, a light emitting layer, a ground layer, and a light-transmitting second electrode in this order over a substrate, in which the ground layer is formed from a light-transmitting and electrically conductive material, and its surface on which the second electrode is stacked has a surface free energy of 33 to 97 mJ/m2, and the second electrode includes a silver thin film layer formed of silver or containing silver as a main constituent.

The film thickness of the silver thin film layer is desirably 10 to 20 nm.

First Embodiment

1. General Configuration of Organic EL Display Panel

Figure 1:
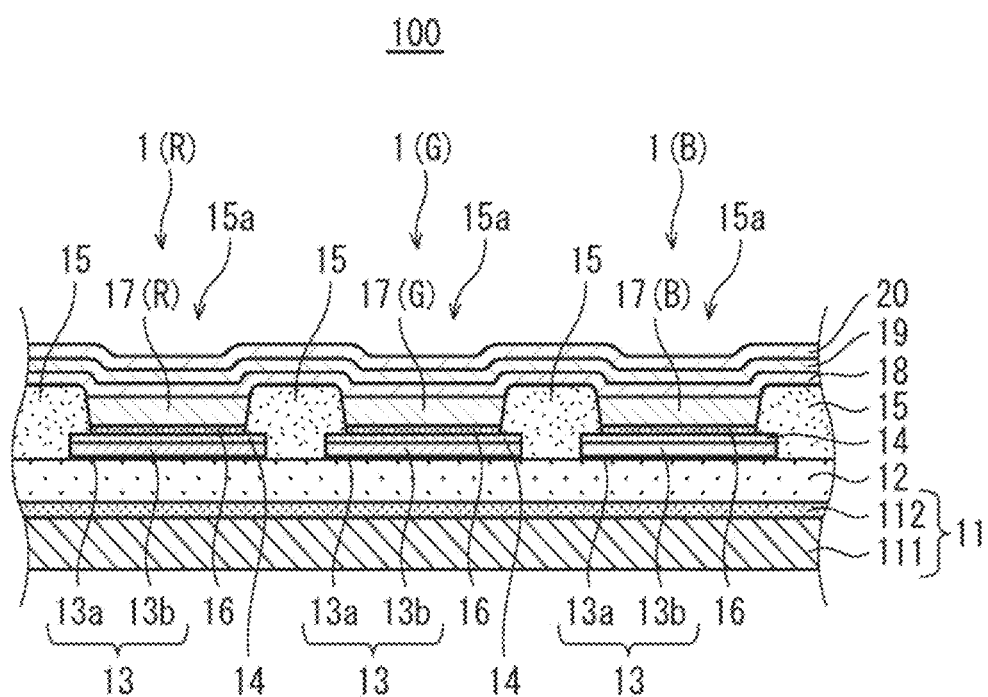
FIG. 1 is a sectional view schematically depicting the configuration of an organic EL display panel according to one embodiment.

FIG. 1 is a partial enlarged sectional view depicting general configuration of an organic EL display panel 100 according to a first embodiment. The organic EL display panel 100 has a plurality of organic EL elements 1 arranged in a matrix pattern on a substrate 11. One organic EL element corresponds to one sub-pixel, which corresponds to one of luminescent colors of R (red), G (green), and B (blue). One pixel is composed of three sub-pixels which correspond to R, G, and B. In other words, one pixel is composed of three organic EL elements 1, namely, an organic EL element 1(R) corresponding to R color, an organic EL element 1(G) corresponding to G color, and an organic EL element 1(B) corresponding to B color. The organic EL display panel 100 is a so-called top emission type color display panel having a display surface on the upper side in the figure.

Note that where it is unnecessary to particularly distinguish the constituent elements from one another by luminescent color, the symbols (R), (G), and (B) are not used. For example, where the luminescent colors are not distinguished from one another, the organic EL element is referred to simply as organic EL element 1.

The organic EL display panel 100 includes the substrate 11, an interlayer insulating layer 12, lower electrodes 13, a hole injection layer 14, a partition wall layer 15, a hole transport layer 16, light emitting layers 17 (17(R), 17(G), 17(B)), an electron transport layer 18, an upper electrode 19, and a sealing layer 20.

Of these constituent elements, the substrate 11, the interlayer insulating layer 12, the electron transport layer 18, the upper electrode 19, and the sealing layer 20 are formed in common to a plurality of pixels.

Each of the components of the organic EL display panel 100 will be described below.

(1) Substrate

The substrate 11 includes a base material 111 which is an insulating material, and a TFT (Thin Film Transistor) layer 112. The TFT layer 112 is formed therein with driving circuits (not depicted) on a sub-pixel basis. As the material from which the base material 111 is formed, there is used a glass, for example. Examples of the glass material include such glasses as no alkali glass, soda glass, nonfluorescent glass, phosphate glass, borate glass, and quartz.

(2) Interlayer Insulating Layer

The interlayer insulating layer 12 is formed on the substrate 11. The interlayer insulating layer 12 is formed from a resin material, and is for planarizing steps present in an upper surface of the TFT layer 112. As the material from which the interlayer insulating layer 12 is formed, there is used a positive type photosensitive material, for example. Examples of the photosensitive material include acrylic resins, polyimide resins, siloxane resins, and phenolic resins.

(3) Lower Electrode (Anode)

The lower electrodes 13 as first electrodes include an electrically conductive material, and they are formed on the interlayer insulating layer 12 on a sub-pixel basis. The lower electrode 13 is an anode, and is composed of a barrier metal layer 13a, and a lower electrode layer 13b stacked on the barrier metal layer 13a. The barrier metal layer 13a includes, for example, a metal or alloy containing a transition metal element such as tungsten (W), molybdenum (Mo), and iron (Fe). In the present embodiment, the barrier metal layer 13a includes tungsten.

In addition, since the organic EL display panel 100 according to the present embodiment is of the top emission type, the lower electrode layer 13b may well be formed from an electrically conductive material having a light reflective property. Examples of the light-reflective electrically conductive material include metals. Specifically, Ag (silver), Al (aluminum), aluminum alloys, Mo (molybdenum), APC (alloy of silver, palladium, and copper), ARA (alloy of silver, rubidium, and gold), MoCr (alloy of molybdenum and chromium), MoW (alloy of molybdenum and tungsten), NiCr (alloy of nickel and chromium) and the like can be used. In the present embodiment, the lower electrode layer 13b includes a metallic material containing aluminum, specifically ACL (alloy of aluminum and cobalt and lanthanum).

Note that the barrier metal layer 13a may be absent.

Though not illustrated in this sectional view, the interlayer insulating layer 12 is formed therein with contact holes on a sub-pixel basis. A TFT connection wiring is embedded in the contact hole, and the lower electrode 13 is electrically connected through the TFT connection wiring to the driving circuit formed in the TFT layer 112.

(4) Hole Injection Layer

The hole injection layer 14 has a function of promoting injection of holes from the lower electrode 13 into the light emitting layer 17. The hole injection layer 14 includes, for example, a metallic oxide, and is disposed on the lower electrode 13. The formation of the hole injection layer 14 is conducted by a sputtering method, for example.

As the metallic oxide as the material for forming the hole injection layer 14, there can be used, for example, tungsten oxide (WOx), molybdenum oxide (MoOx), and oxides of silver (Ag), chromium (Cr), vanadium (V), nickel (Ni), iridium (Ir) and the like.

(5) Partition Wall Layer

The partition wall layer 15 is formed on the hole injection layer 14 in a state where partial regions of an upper surface of the hole injection layer 14 are exposed and the surrounding regions are covered. Of the upper surface of the hole injection layer 14, the regions which are not covered with the partition wall layer 15 (these regions are referred to as "openings") correspond to sub-pixels. In other words, the partition wall layer 15 has the openings 15a provided on a sub-pixel basis.

The partition wall layer 15 includes, for example, an insulating organic material (e.g., acrylic resin, polyimide resin, novolak resin, or phenolic resin). In the case where the light emitting layers 17 are formed by a coating method, the partition wall layer 15 functions as structures for preventing the applied inks from flowing over, and, in the case where the light emitting layers 17 are formed by a vapor deposition method, the partition wall layer 15 functions as structures for placing a vapor deposition mask thereon.

In the present embodiment, the partition wall layer 15 includes a resin material; for example, a positive type photosensitive material can be used. Specific examples of the photosensitive material include acrylic resins, polyimide resins, siloxane resins, and phenolic resins.

(6) Hole Transport Layer

The hole transport layer 16 has a function of transporting holes, injected from the hole injection layer 14, to the light emitting layer 17, and is formed from an organic material having a high hole mobility, for efficiently transporting the holes from the hole injection layer 14 to the light emitting layer 17.

The formation of the hole transport layer 16 is conducted by application of an organic material solution and drying thereof. As the organic material for forming the hole transport layer 16, there can be used polymeric compounds such as polyfluorene and its derivative, and polyarylamines and their derivatives.

In addition, the hole transport layer 16 may be formed by use of triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, porphyrin compounds, aromatic tertiary amine compounds, styrylamine compounds, butadiene compounds, polystyrene derivatives, triphenylmethane derivatives, or tetraphenylbenzene derivatives. Particularly preferably, porphyrin compounds, aromatic tertiary amine compounds, styrylamine compounds and the like may be used. In this case, the hole transport layer 16 is formed by a vacuum vapor deposition method.

(7) Light Emitting Layer

The light emitting layers 17 contain organic light emitting materials, and are formed in the openings 15a located on the upper side of the lower electrodes 13. The light emitting layers 17 have a function of emitting light in each color of R, G, and B through recombination of holes and electrons.

In the organic EL display panel 100 according to the present embodiment, the light emitting layers 17 are each formed by applying an ink containing the organic light emitting material to the inside of the openings 15a.

As the organic light emitting material contained in the light emitting layers 17, there can be used, for example, fluorescent substances such as oxinoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds and azaquinolone compounds, pyrazoline derivatives and pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compound, thiapyrylium compounds, selenapyrylium compounds, telluropyrylium compounds, aromatic aldadiene compounds, oligophenylene compounds, thioxanthene compounds, cyanine compounds, acridine compounds, metal complexes of 8-hydroquinoline compounds, metal complexes of 2-bipyridine compounds, complexes of Schiff base and Group III metals, oxine metal complexes, and rare earth complexes.

In addition, known phosphorescent substances such as phosphorescent metal complexes, for example, tris(2-phenylpyridine)iridium can be used. Besides, the light emitting layers 17 may be formed by use of a polymeric compound such as polyfluorene and its derivatives, polyphenylene and its derivatives, polyarylamines and their derivatives, or a mixture of the above-mentioned low-molecular-weight compound and the above-mentioned polymeric compound.

(8) Electron Transport Layer

The electron transport layer 18 is provided on the light emitting layers 17 and the partition wall layer 15 in common to a plurality of pixels, and has a function of transporting electrons, injected from the upper electrode 19, to the light emitting layer 17. The electron transport layer 18 is formed, for example, by use of an oxadiazole derivative (OXD), a triazole derivative (TAZ), a phenanthroline derivative (BCP, Bphen) or the like.

Note that for obtaining homogeneity of film properties of the silver upper electrode 19 to be stacked subsequently, the surface roughness Ra of the electron transport layer 18 is set to within the range of 0.3 to 2.7 nm. The details will be described later.

(9) Upper Electrode (Cathode)

The upper electrode 19 as a second electrode is provided on the electron transport layer 18 in common to a plurality of pixels, and is a cathode. The upper electrode 19 is formed in a film form by a sputtering method using silver as a target. The upper electrode 19 is composed of a silver thin film having a thickness of 10 to 20 nm. With the upper electrode 19 formed in such a thickness as to be light-transmitting, light generated in the light emitting layers 17 can be taken out on the upper electrode 19 side.

(10) Sealing Layer

The sealing layer 20 is formed on the upper electrode 19. The sealing layer 20 has a function of preventing impurities (water, oxygen) from intruding from the opposite side of the substrate 11 into the upper electrode 19, the electron transport layer 18, the light emitting layer 17 or the like, and restraining these layers from being deteriorated due to the impurities.

Since the organic EL display panel 100 according to the present embodiment is a top emission type display panel, a light-transmitting material such as SiN (silicon nitride) or SiON (silicon oxynitride), for example, is used as the material for the sealing layer 20.

(11) Others

Note that although not illustrated in FIG. 1, color filters and/or an upper substrate may be placed over and joined to the sealing layer 20. Where the upper substrate is provided, it is thereby possible to protect the upper electrode 19, the electron transport layer 18, the light emitting layer 17 and the like from impurities more securely.

2. Relationship Between Surface Roughness Ra of Electron Transport Layer 18 and Homogeneity of Silver Thin Film of Upper Electrode 19

As has been described in "How one mode of the present disclosure has been reached" above, the generation of the island formation phenomenon at the time of forming the silver thin film is considered to be due to the large moving amount of silver atoms adsorbed on the surface of the ground layer.

In view of this, the present inventor paid attention to the surface roughness of the ground layer. It is considered that if the surface roughness is appropriate, the silver atoms enter the minute recesses and the moving amount of the silver atoms is thereby limited, so that generation of the island formation phenomenon is restrained.

In view of this, an experiment was conducted in which the surface roughness Ra (nm) of the electron transport layer (ETL) 18 as a ground layer for the upper electrode 19 is varied and the sheet resistance ($\Omega/\square$) of the upper electrode 19 formed on the surface of the electron transport layer 18 was measured. Since the sheet resistance is increased when the island formation phenomenon is generated as aforementioned, measurement of the sheet resistance makes it possible to know the degree of generation of the island formation phenomenon.

FIG. 4 is a table depicting the results of the above-mentioned experiment.

Film formation for the electron transport layer 18 as the ground layer was conducted by a vacuum vapor deposition method. With the substrate temperature kept constant at 25° C., film forming rate was varied, whereby the surface roughness Ra of the electron transport layer 18 was varied.

Here, the surface roughness Ra is the arithmetic mean roughness defined by JIS B 0601:2001. Specifically, when a portion of a standard length L in the direction of an average line of a roughness curve is cut off from the roughness curve, an X-axis is taken in the direction of the average line of the cut-off portion, a Y-axis is taken in the direction of vertical magnification, and the roughness curve is represented by y=f(x), then the surface roughness Ra is defined by a value obtained by the following formula, expressed in micrometers (μm) (in the table of FIG. 4, the value is expressed in nanometers (nm) for convenience). Note that Ra can be measured by an atomic force microscope (AFM).

$$Ra = \frac{1}{L}\int_0^L |f(x)|dx$$

In addition, the film thickness of the electron transport layer 18 was set to 30 nm, and the film thickness of the upper electrode (silver thin film) 19 was set to 15 nm.

From the table of FIG. 4, the followings are seen.

(1) As the film forming rate of the electron transport layer increases, the surface roughness of the layer increases.

(2) As the surface roughness of the electron transport layer increases, silver nucleus formation is restrained and silver is liable to be formed into a continuous film, so that the sheet resistance decreases.

(3) As the surface roughness of the electron transport layer increases, silver is formed into a continuous film, and the surface roughness Ra of the silver thin film decreases. However, when the surface roughness Ra of the electron transport layer is increased beyond a predetermined value (in the experimental results set forth in FIG. 4, Ra=0.8), the surface roughness of the upper electrode also increases gradually.

(Evaluation of Experimental Results)

When the surface roughness Ra of the electron transport layer was 0.2 nm, islands were formed, so that the sheet resistance of the silver thin film as the upper electrode had a high value of 10.3Ω/□. In addition, the surface roughness Ra of the silver thin film was also as large as 3.9 nm, and the film properties were nonuniform, which hampers use as a practical product, so that the evaluation was "x" (bad).

When the surface roughness Ra of the electron transport layer was in the range of 0.3 to 2.7 nm, the sheet resistance and the surface roughness Ra of the silver thin film were both in allowable ranges, so that evaluation was "○" (good).

However, if the surface roughness Ra of the electron transport layer increased to 3.3 nm, the surface roughness Ra of the silver thin film would increase to 3.7 nm, though the sheet resistance of the silver thin film was lowered.

When the surface roughness Ra of the upper electrode is thus increased, the light transmitting property is deteriorated, and concentration of an electric field in a larger-thickness portion occurs to generate an eddy current, and a dark spot or the like may be generated, so that the evaluation is "x" (bad).

Therefore, the surface roughness Ra of the electron transport layer is set to be 0.3 to 2.7 nm, whereby the upper electrode can be formed on homogeneous silver.

Figure 5:
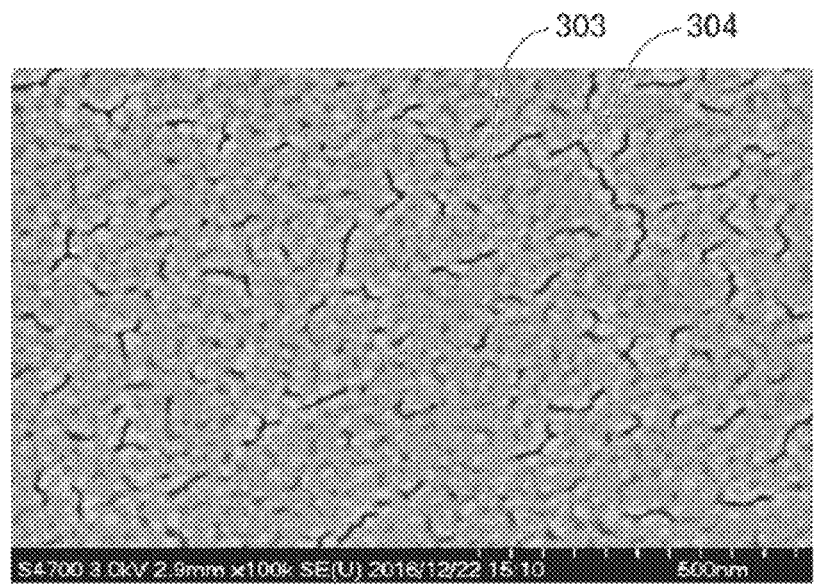
FIG. 5 is an electron microphotograph depicting a film formation state of an upper electrode in a comparative example.
Figure 6:
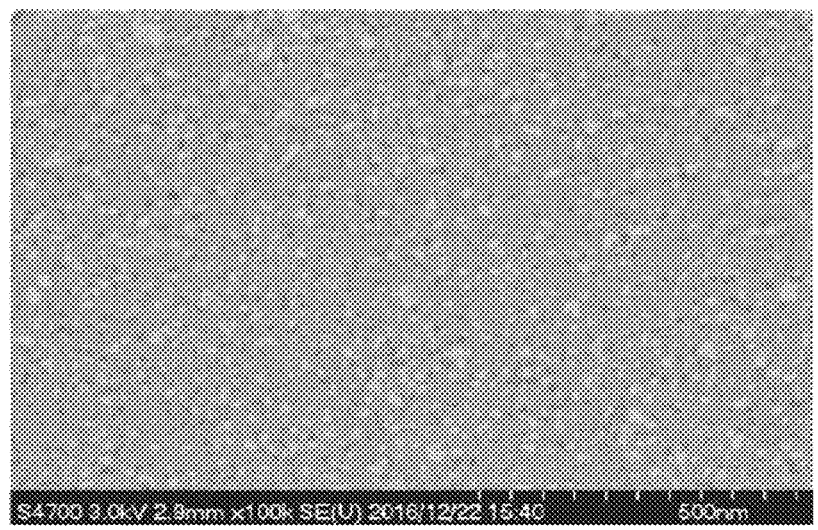
FIG. 6 is an electron microphotograph depicting a film formation state of an upper electrode according to the present embodiment.

FIGS. 5 and 6 depict electron microphotographs of the surfaces of the upper electrodes 19 of samples.

FIG. 5 is a photograph of the relevant surface when the upper electrode was formed in a condition where the surface roughness Ra of the electron transport layer as the ground layer was set to 0.2 nm as a comparative example. In this case, in the upper electrode, islands 303 were formed, and a void 304 was generated between the islands.

On the other hand, FIG. 6 is a photograph of the relevant surface when the upper electrode was formed in a condition where the surface roughness Ra of the electron transport layer as the ground layer was set to 0.5 nm. A comparatively uniform surface free of void was obtained.

While FIG. 4 has depicted the experimental results in the case where the film thickness of the silver thin film layer constituting the upper electrode 19 was 15 nm, the present inventor made an experiment also in the cases where the film thickness of the silver thin film layer was 10 nm and 20 nm, for confirmation.

FIG. 7 is a table depicting the experimental results in the case where the film thickness of the silver thin film layer was 10 nm.

The other experimental conditions than the film thickness of the silver thin film layer were the same as in the case of FIG. 4.

(Evaluation of Experimental Results)

When the surface roughness Ra of the electron transport layer was 0.2 nm, islands were formed and, hence, the sheet resistance of the silver thin film as the upper electrode had a high value of 13.6Ω/□. In addition, the surface roughness Ra of the silver thin film also had a large value of 4.5 nm, and the film properties were nonuniform, which hampers use as a practical product, so that the evaluation was "x" (bad).

When the surface roughness Ra of the electron transport layer was in the range of 0.3 to 2.7 nm, the sheet resistance and the surface roughness Ra of the silver thin film were both in allowable ranges, so that evaluation was "○" (good).

However, if the surface roughness Ra of the electron transport layer increased to 3.3 nm, the surface roughness Ra of the silver thin film would increase to 3.5 nm, though the sheet resistance of the silver thin film was lowered.

When the surface roughness Ra of the upper electrode is thus increased, the light transmitting property is deteriorated, and concentration of an electric field in a larger-thickness portion occurs to generate an eddy current, and a dark spot or the like may be generated, so that the evaluation is "x" (bad).

Therefore, even in the case where the film thickness of the upper electrode 19 is 10 nm, if the surface roughness Ra of the electron transport layer is set to be 0.3 to 2.7 nm, the upper electrode can be formed on homogeneous silver.

FIG. 8 is a table depicting the experimental results in the case where the film thickness of the silver thin film layer was 20 nm.

The other experimental conditions than the film thickness of the silver thin film layer were the same as in the cases of FIG. 4 and FIG. 7.

(Evaluation of Experimental Results)

When the surface roughness Ra of the electron transport layer was 0.2 nm, islands were formed and, hence, the sheet resistance of the silver thin film as the upper electrode had a high value of 9.3Ω/□. In addition, the surface roughness Ra of the silver thin film also had a large value of 3.5 nm, and the film properties were nonuniform, which hampers use as a practical product, so that the evaluation was "x" (bad).

When the surface roughness Ra of the electron transport layer was in the range of 0.3 to 2.7 nm, the sheet resistance and the surface roughness Ra of the silver thin film were both in allowable ranges, so that evaluation was "○" (good).

However, if the surface roughness Ra of the electron transport layer increased to 3.3 nm, the surface roughness Ra of the silver thin film would increase to 3.9 nm, though the sheet resistance of the silver thin film was lowered.

When the surface roughness Ra of the upper electrode is thus increased, the light transmitting property is deteriorated, and concentration of an electric field in a larger-thickness portion occurs to generate an eddy current, and a dark spot or the like may be generated, so that the evaluation is "x" (bad).

Therefore, it can be said that even in the case where the film thickness of the upper electrode 19 is 20 nm, if the surface roughness Ra of the electron transport layer is set to be 0.3 to 2.7 nm, the upper layer can be formed on homogeneous silver.

(Summary)

As has been described above, in the case where the surface roughness Ra of the electron transport layer as a ground layer is 0.3 to 2.7 nm (this condition will hereinafter be referred to as "surface roughness condition"), it is ensured, with the film thickness of the upper electrode made of silver stacked on the ground layer being in the range of 10 to 20 nm, that the sheet resistance of the upper electrode is small, the film properties of the upper electrode are uniform, and the film properties of the cathode as a light-transmitting electrode can be stabilized.

3. Method of Manufacturing Organic EL Display Panel 100

An embodiment of a method of manufacturing the organic EL display panel 100 will be described below, referring to FIGS. 9A, 9B, 9C, 9D, 9E, 9F, 10A, 10B, 10C, 10D, 11A, 11B, 11C and 12. Note that FIGS. 9A, 9B, 9C, 9D, 9E, 9F, 10A, 10B, 10C, 10D, 11A, 11B and 11C are partial sectional views schematically depicting a manufacturing process of the organic EL display panel 100, and FIG. 12 is a schematic flow chart depicting the manufacturing process of the organic EL display panel 100.

Figure 9A:
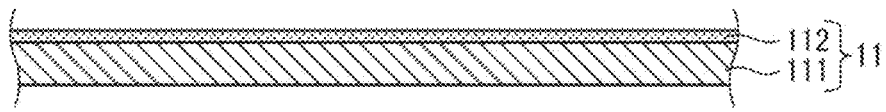
Figure 12:
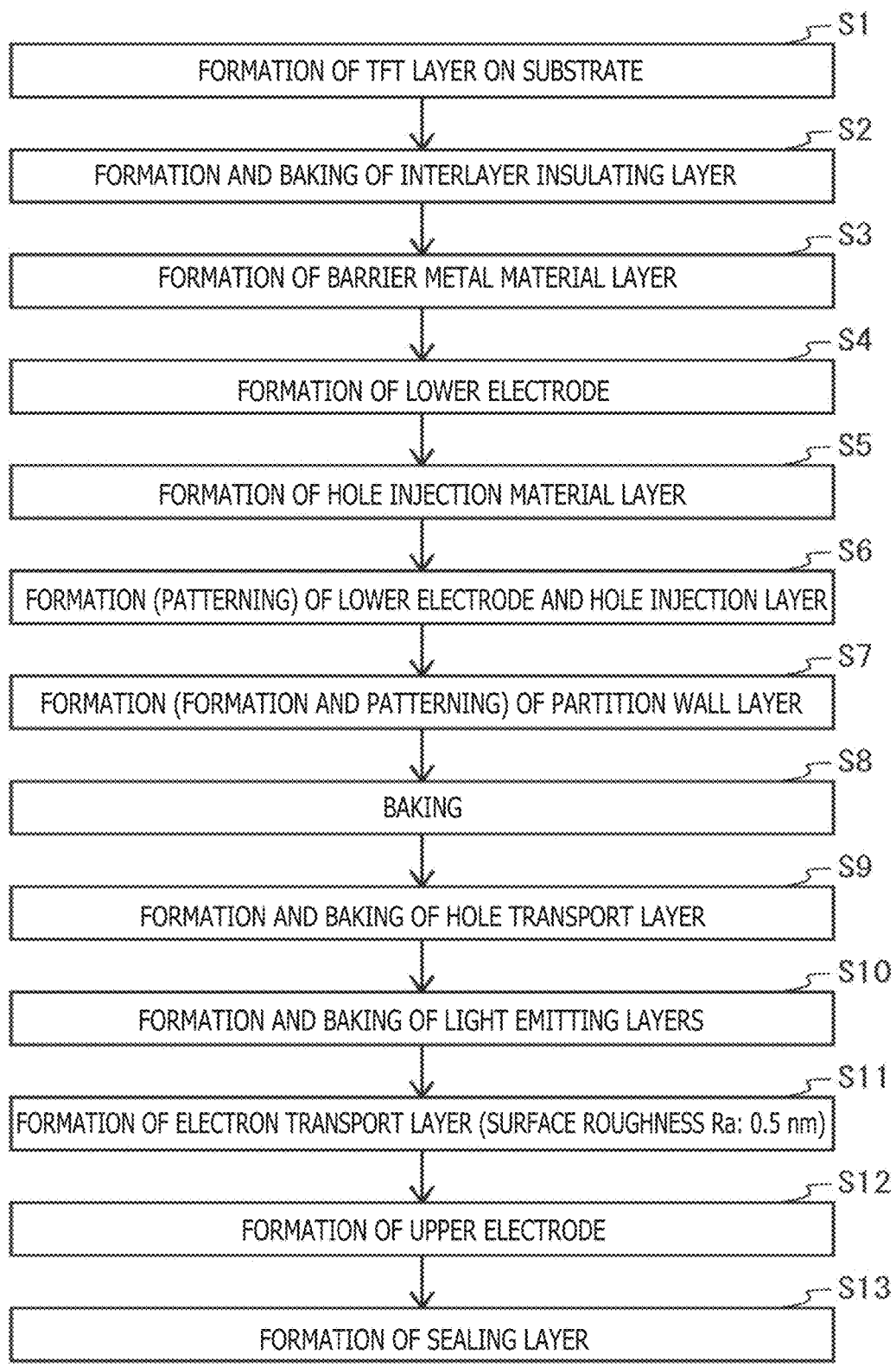
FIG. 12 is a flow chart depicting the manufacturing process of the organic EL display panel according to the embodiment.

First, as depicted in FIG. 9A, a TFT layer 112 is formed on a base material 111, to form a substrate 11 (step S1 in FIG. 12).

Figure 9B:
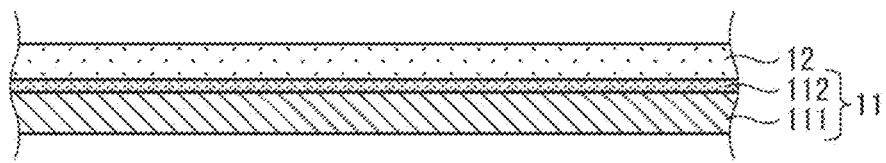

Next, as depicted in FIG. 9B, an interlayer insulating layer 12 is formed in the form of a film on the substrate 11 and is baked (step S2 in FIG. 12). As an interlayer insulating layer resin as a material for the interlayer insulating layer 12, an acrylic resin which is a positive type photosensitive material is used, in the present embodiment. To form the interlayer insulating layer 12, an interlayer insulating layer solution prepared by dissolving the acrylic resin as the interlayer insulating layer resin in an interlayer insulating layer solvent (e.g., PGMEA) is applied to the substrate 11 to form a film, followed by baking. The baking is conducted, for example, at a temperature of 150° C. to 210° C. for 180 minutes.

Figure 9C:
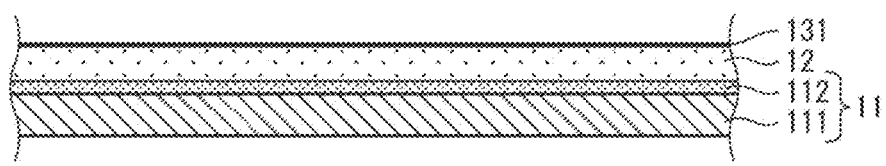

Subsequently, as depicted in FIG. 9C, a barrier metal material layer 131 is uniformly formed on the interlayer insulating layer 12 (step S3 in FIG. 12). The barrier metal material layer 131 is formed of, for example, a metal or alloy containing a transition metal element such as tungsten (W), molybdenum (Mo), and iron (Fe). As a film forming method for forming the barrier material layer 131, there can be used a sputtering method, for example. In the sputtering method, for example, a flat plate made of the metal or alloy containing a transition metal element may be used as a target member, and argon gas may be used as an inert gas.

In the present embodiment, the barrier metal material layer 131 is formed, for example, in a film thickness of 40 nm using tungsten as a material.

Figure 9D:
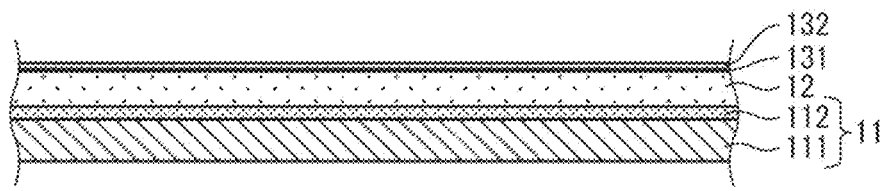

Further, subsequently, as depicted in FIG. 9D, a lower electrode layer 132 is formed on the barrier metal material layer 131. The lower electrode layer 132 is uniformly formed on the interlayer insulating layer 12 by a sputtering method using a light-reflective electrically conductive material (step S4 in FIG. 12).

In the present embodiment, the light-reflective electrically conductive material for forming the lower electrode layer 132 is a metallic material containing aluminum, specifically, ACL (alloy of aluminum and cobalt and lanthanum). In addition, the thickness of the lower electrode layer 132 is, for example, 50 to 300 nm, and is 200 nm in the present embodiment.

In the present embodiment, as depicted in FIG. 9D, the lower electrode layer 132 and the barrier metal material layer 131 constitute a lower electrode material layer 130.

Figure 9E:
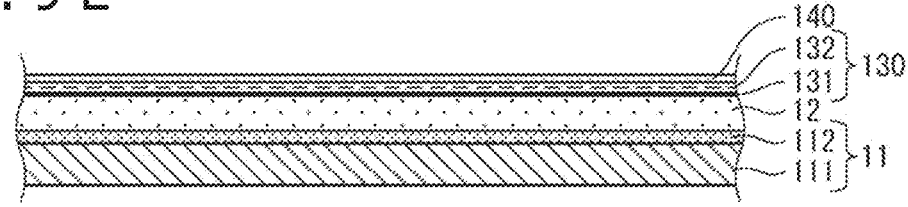

Subsequently, as depicted in FIG. 9E, a hole injection material layer 140 is formed on the lower electrode material layer 130 composed of the lower electrode layer 132 and the barrier metal material layer 131 (step S5 in FIG. 12). In the organic EL display panel 100 according to the present embodiment, the hole injection material layer 140 is a layer of tungsten oxide, and it is formed by a reactive sputtering method.

Figure 9F:
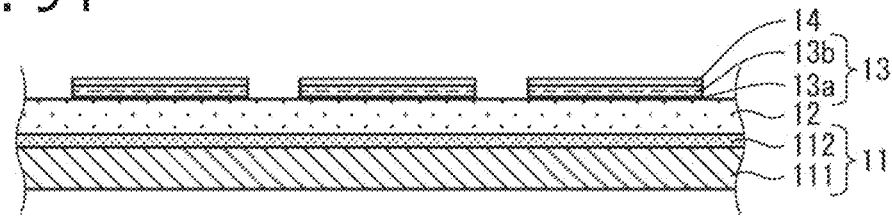

Then, as depicted in FIG. 9F, the lower electrode material layer 130 and the hole injection material layer 140 are patterned by etching, to form a plurality of lower electrodes 13 and a plurality of hole injection layers 14 which are partitioned on a sub-pixel basis (step S6 in FIG. 12).

In the present embodiment, the hole injection material layer 140 is patterned by dry etching, whereas the lower electrode material layer 130 is patterned by wet etching, but the methods for patterning are not particularly limited to these.

Figure 10A:
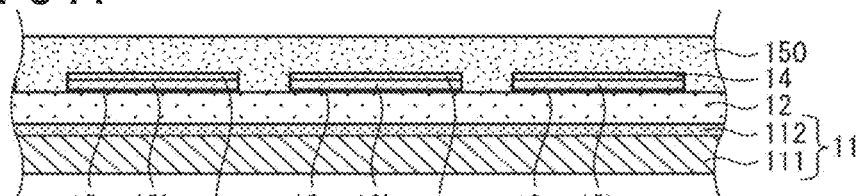
Figure 10B:
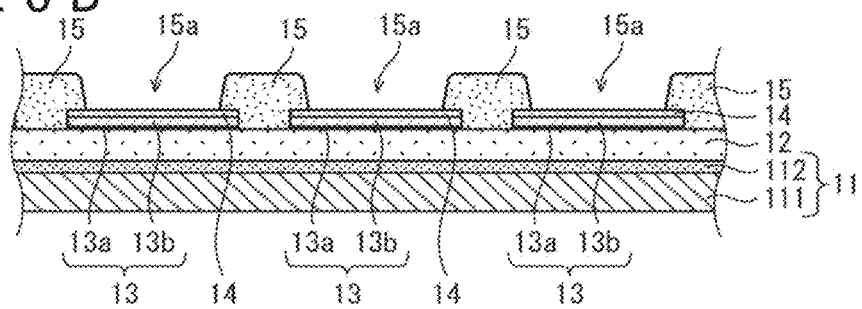

Subsequently, as depicted in FIG. 10A, a partition wall layer resin as a material for a partition wall layer 15 is applied onto the hole injection layers 14 and the interlayer insulating layer 12, to form a partition wall material layer 150. As the partition wall layer resin, there is used, for example, a phenolic resin which is a positive photosensitive material. The partition wall material layer 150 is formed, for example, by uniformly applying a solution prepared by dissolving the phenolic resin as the partition wall layer resin in a solvent (e.g., a mixed solvent of ethyl lactate and GBL) onto the hole injection layers 14 and the interlayer insulating layer 12 by a spin coating method or the like.

Then, the partition wall material layer 150 is subjected to pattern exposure and development to form the partition wall layers 15 (FIG. 10B; step S7 in FIG. 12), and the partition wall layers 15 are baked (step S8 in FIG. 12). By this, openings 15a to be regions for forming light emitting layers 17 are defined. The baking of the partition wall layers 15 is conducted, for example, at a temperature of 150° C. to 210° C. for 60 minutes.

In addition, in the step of forming the partition wall layers 15, further, the surfaces of the partition wall layers 15 may be subjected to a surface treatment with a predetermined basic solution, water, organic solvent or the like or may be subjected to a plasma treatment. This is performed for the purpose of controlling the contact angle of the partition wall layers 15 relative to an ink (solution) applied to the openings 15a or for the purpose of imparting water repellency to the surfaces.

Figure 10C:
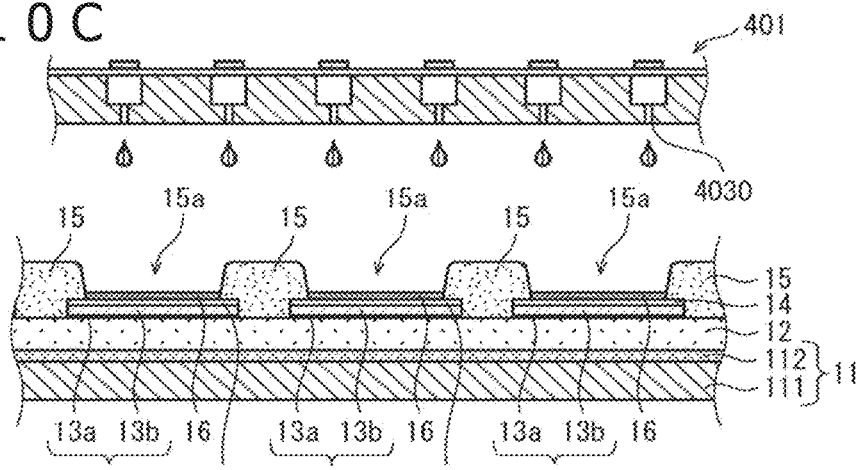

Next, as depicted in FIG. 10C, an ink containing a constituent material of the hole transport layers 16 is jetted from nozzles 4030 of an ink jet head 401 toward the openings 15a defined by the partition wall layers 15 to be applied onto the hole injection layers 14 in the openings 15a, followed by baking (drying), to form hole transport layers 16 (step S9 in FIG. 12).

Figure 10D:
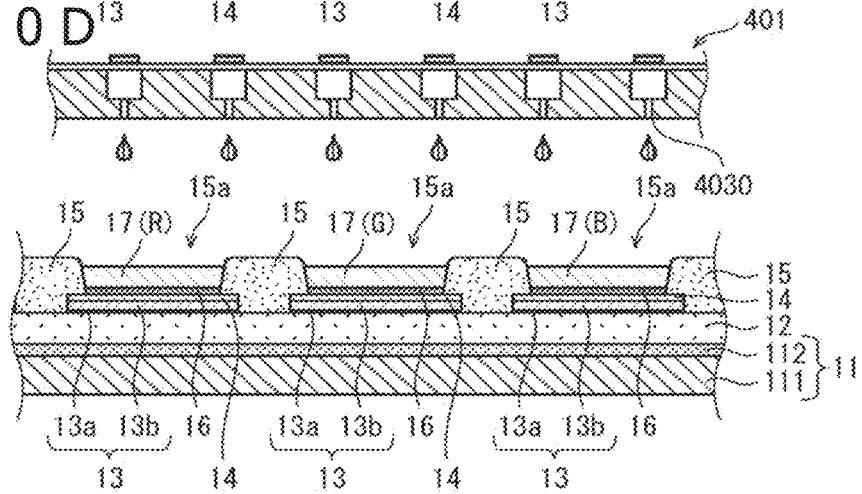

Then, as depicted in FIG. 10D, inks containing constituent materials of the light emitting layers 17 are jetted from the nozzles 4030 of the ink jet head 401 to be applied onto the hole transport layers 16 in the openings 15a, followed by baking (drying), to form the light emitting layers 17 (step S10 in FIG. 12).

Figure 11A:
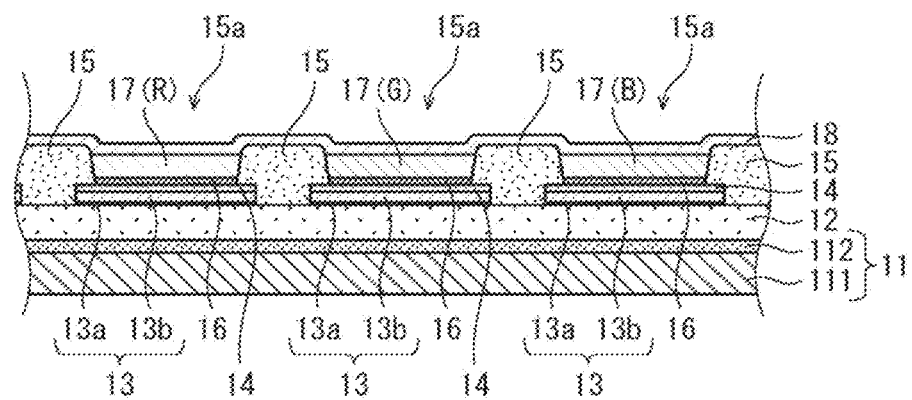

Subsequently, as depicted in FIG. 11A, a material for constituting an electron transport layer 18 is formed in a film form on the light emitting layers 17 and the partition wall layers 15 in common on a sub-pixel basis by a vacuum vapor deposition method or a sputtering method, to form the electron transport layer 18 (step S11 in FIG. 12).

In this instance, the film forming rate is controlled, for example, to 1.0 Å/s so that the surface roughness Ra of the electron transport layer 18 will be 0.5 nm (see the table in FIG. 4).

Figure 11B:
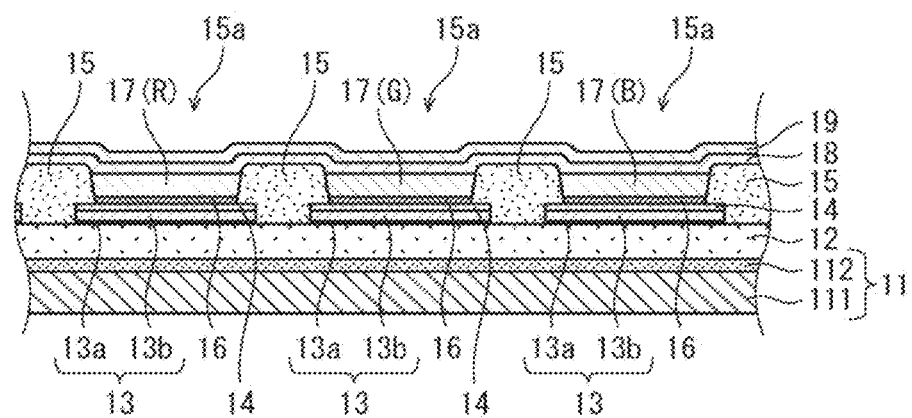

Then, as depicted in FIG. 11B, an upper electrode 19 is formed on the electron transport layer 18. Specifically, a film is formed by a sputtering method using Ag, to form the upper electrode 19 (step S12 in FIG. 12).

Figure 11C:
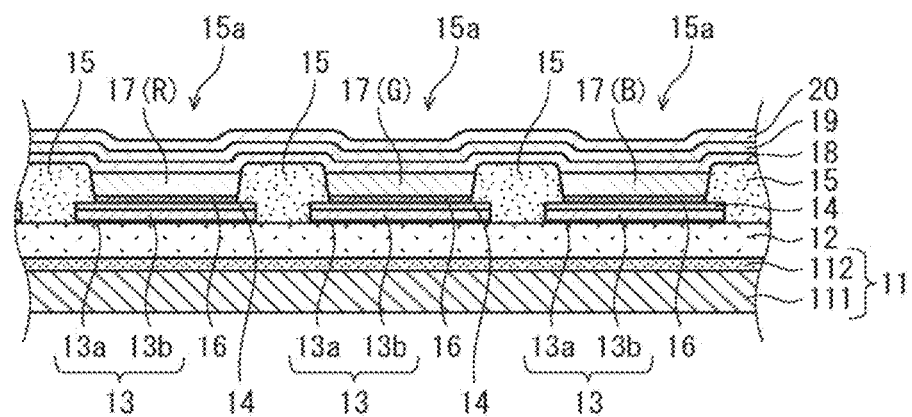

Subsequently, as depicted in FIG. 11C, a film is formed on the upper electrode 19 by a sputtering method, a CVD (Chemical Vapor Deposition) method or the like using SiN as a material, to form a sealing layer 20 (step S13 in FIG. 12).

Note that color filters and/or an upper substrate may be placed on and joined to the sealing layer 20.

Through the above-mentioned steps, the organic EL display panel 100 is completed. In this way, in the organic EL display panel 100 according to the present embodiment, the surface roughness Ra of the electron transport layer 18 as a ground layer for the upper electrode 19 is set to within such a predetermined range that the island formation phenomenon will not be generated in forming the upper electrode 19.

4. General Configuration of Organic EL Display Device

Figure 13:
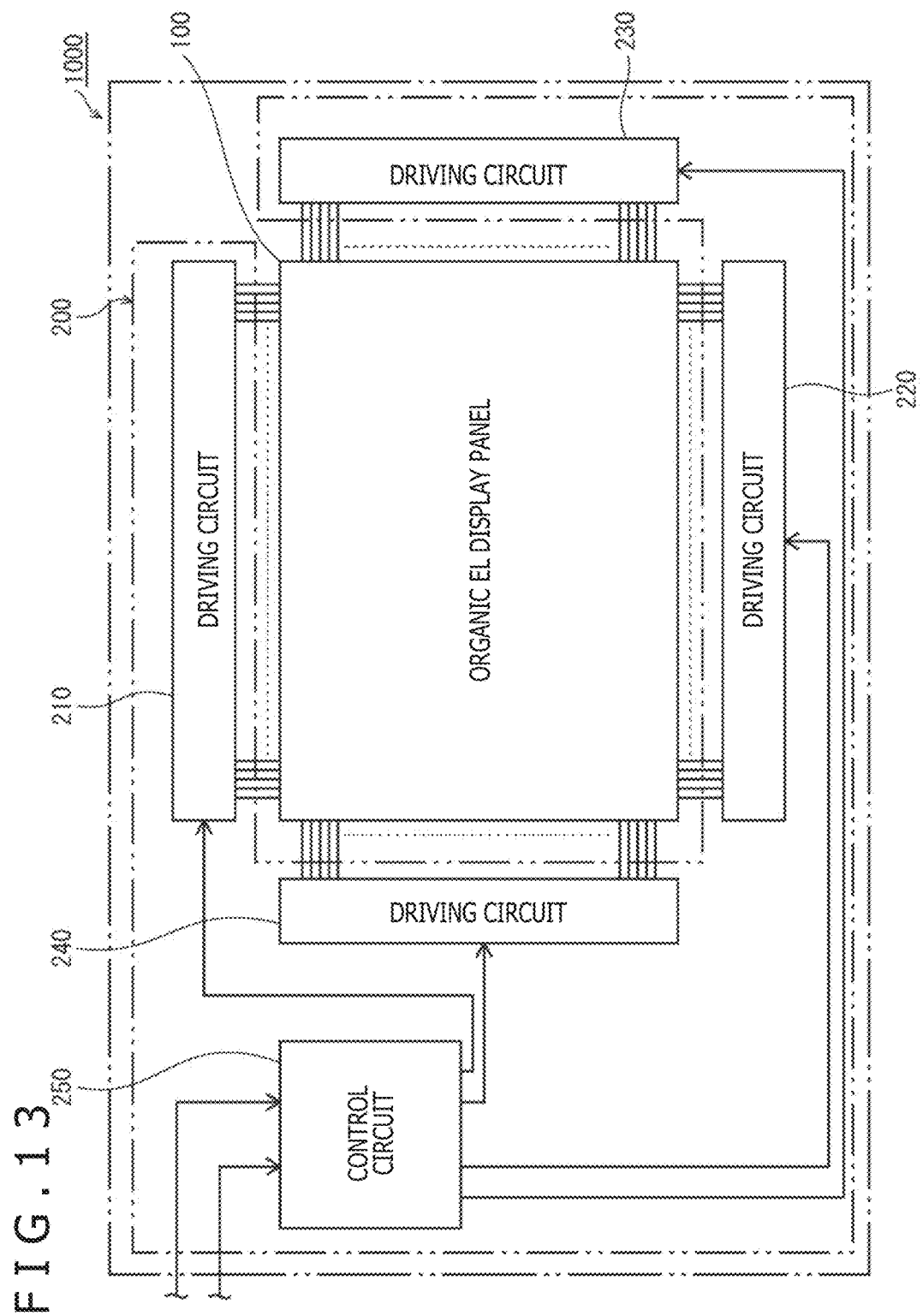
FIG. 13 is a schematic block diagram depicting general configuration of an organic EL display device according to one embodiment.

FIG. 13 is a schematic block diagram depicting the configuration of an organic EL display device 1000 including the organic EL display panel 100. As depicted in FIG. 13, the organic EL display device 1000 includes the organic EL display panel 100, and a driving control section 200 connected thereto. The driving control section 200 includes four driving circuits 210 to 240, and a control circuit 250.

Note that in a practical organic EL display device 1000, the layout of the driving control section 200 relative to the organic EL display panel 100 is not limited to this.

Second Embodiment

In the first embodiment described above, the surface roughness Ra of the electron transport layer 18 as a ground layer for the upper electrode 19 has been controlled to within a predetermined range, to restrain the moving amount of silver atoms adsorbed on the ground layer, thereby restraining the generation of the island formation phenomenon at the time of forming the upper electrode 19. However, the present inventor has found out that the moving amount of the silver atoms can be restrained also by another method.

Specifically, attention was paid to the fact that as the surface free energy of a solid is greater, the solid is more liable to adsorb gasses or particulates and to adhere to other solids. In view of this, the present inventor conducted an experiment of stacking an upper electrode on an electron transport layer while varying the surface free energy of the electron transport layer. Control of the surface free energy of a solid can be accomplished, for example, by modification of the surface by a UV ozone treatment.

FIG. 14 is a table depicting the results of the experiment thus conducted.

The film forming rate in forming the electron transport layer was kept constant at 0.2 Å/s, the substrate temperature was kept constant at 25° C., and only the UV ozone treatment time for the electron transport layer was varied. After the formation of the upper electrode in this way, the sheet resistance and the surface roughness Ra of the upper electrode and the presence or absence of adhesion of foreign matter were evaluated.

Note that the method for measuring the surface free energy here is by a surface free energy contact angle measuring method. The contact angle measuring method is a method used as a general measuring method, and examples thereof include the method described in D. H. KAELBLE, JOURNAL OF APPLIED POLYMER SCIENCE, Vol. 18, pp. 1869-1889 (1974).

Specifically, one drop of a liquid having a known surface free energy is made to fall onto a solid surface as an object of measurement, and the contact angle is measured. From the contact angle thus measured, the surface free energy of the solid surface is calculated.

The specific measuring method is defined as follows.

$$\gamma L = \gamma Ld + \gamma Lp$$

$$\gamma S = \gamma Sd + \gamma Sp$$

$$\gamma L(1+\cos\theta) = 2(\gamma Sd\gamma Ld)^{1/2} + 2(\gamma Sp\gamma Lp)^{1/2}$$

$\gamma Ld$: disperse component of surface free energy of liquid
$\gamma Lp$: polar component of surface free energy of liquid
$\gamma Sd$: disperse component of surface free energy of solid
$\gamma Sp$: polar component of surface free energy of solid
$\gamma L$: surface free energy of liquid
$\gamma S$: surface free energy of solid
$\theta$: contact angle Measurement of the contact angle $\theta$ is conducted using a liquid (e.g., water, formamide) for which the components ($\gamma L$, $\gamma Ld$, $\gamma Lp$) of surface free energy are known, and $\gamma Sd$ and $\gamma Sp$ are deduced from the above equations, whereby $\gamma S$ is determined. Note that for the measurement of the contact angle $\theta$, an automatic contact angle meter DM-501 made by Kyowa Interface Science Co., Ltd. was used.

From the table in FIG. 14, the followings are seen.

(1) As the UV ozone treatment time is set longer, the surface free energy of the electron transport layer increases.

(2) As the surface free energy of the electron transport layer increases, silver nucleus growth is restrained, silver is more liable to be formed into a continuous film, and the sheet resistance is lowered.

(3) When the surface free energy of the electron transport layer increases and silver is formed into a continuous film, the surface roughness Ra of the silver thin film decreases.

(4) When the surface free energy of the electron transport layer increases excessively, adhesion of foreign matter onto the electron transport layer is liable to occur before formation of the silver thin film.

(Evaluation of Experimental Results)

Specifically, in the case where a UV ozone treatment was not conducted at all (0 seconds), the surface free energy of the electron transport layer was 25 mJ/m2, and adhesion of foreign matter was not observed. However, the sheet resistance of the upper electrode was as high as 10.3Ω/□, and the surface roughness Ra of the upper electrode was as high as 3.9 nm, so that it was determined that islands had been formed. Consequently, the evaluation was "x" (bad).

When the UV ozone treatment time was 1 to 5 seconds, the surface free energy was 33 to 97 mJ/m2, and, in each of the cases, the sheet resistance and the surface roughness Ra of the upper electrode were both within allowable ranges, and adhesion of foreign matter was not observed. Consequently, the evaluation was "∘" (good).

However, when the UV ozone treatment time was set to 10 seconds, the surface free energy became as high as 150 mJ/m2, and, although the sheet resistance and the surface roughness Ra of the upper electrode were both in allowable ranges, adhesion of foreign matter onto the surface of the electron transport layer was observed. Thus, when the surface free energy is too high, minute foreign matter in the atmosphere is also adsorbed, causing a trouble in the subsequent formation of the upper electrode 19. Consequently, the evaluation was "x" (bad).

Thus, when the surface free energy of the electron transport layer as a ground layer for the upper electrode is 33 to 97 mJ/m2, forces for restraining the moving amount of silver atoms are generated, formation of islands is thereby restricted, silver can be formed into a continuous film, and adhesion of foreign matter can be precluded, so that a homogeneous upper electrode can be formed.

Meanwhile, when the film forming rate of the electron transport layer was 0.2 Å/s and the substrate temperature was 25° C., the evaluation in the experiment of surface roughness Ra in FIG. 4 was "x" (bad). Therefore, the optimum range of the surface free energy determined in this second embodiment can be interpreted as a parameter which is determined separately from the surface roughness Ra of the electron transport layer.

While the experimental results in the case where the film thickness of the silver thin film layer constituting the upper electrode 19 was 15 nm were depicted in FIG. 14, the present inventor conducted similar experiments also in the cases where the film thickness of the silver thin film layer was 10 nm and 20 nm, for confirmation.

FIG. 15 is a table depicting the experimental results in the case where the film thickness of the silver thin film layer was 10 nm.

The other experimental conditions than the film thickness of the silver thin film layer were the same as in the case of FIG. 14.

(Evaluation of Experimental Results)

In the case where the UV ozone treatment was not conducted at all (0 seconds), the surface free energy of the electron transport layer was 25 mJ/m2, and adhesion of foreign matter was not observed. However, the sheet resistance of the upper electrode was as high as 13.6Ω/□, and the surface roughness Ra of the upper electrode was as large as 4.5 nm, so that it was determined that islands had been formed. Consequently, the evaluation was "x" (bad).

In the cases where the UV ozone treatment time was 1 second and 5 second, the surface free energy was 33 to 97 mJ/m2, and, in each of the cases, the sheet resistance and the surface roughness Ra of the upper electrode were both in allowable ranges, and adhesion of foreign matter was not observed. Consequently, the evaluation was "○" (good).

However, when the UV ozone treatment time was set to 10 seconds, the surface free energy became as high as 150 mJ/m2, and, although the sheet resistance and the surface roughness Ra of the upper electrode were both in allowable ranges, adhesion of foreign matter onto the surface of the electron transport layer was observed, like in the case of FIG. 14. Thus, when the surface free energy is too high, minute foreign matter in the atmosphere is also adsorbed, causing a trouble in the subsequent formation of the upper electrode 19. Therefore, the evaluation was "x" (bad).

In addition, FIG. 16 is a table depicting the experimental results in the case where the film thickness of the silver thin film layer was 20 nm.

The other experimental conditions than the film thickness of the silver thin film layer were the same as in the cases of FIG. 14 and FIG. 15.

(Evaluation of Experimental Results)

In the case where the UV ozone treatment was not performed at all (0 seconds), the surface free energy of the electron transport layer was 25 mJ/m2, and adhesion of foreign matter was not observed. However, the sheet resistance of the upper electrode was as high as 9.3Ω/□, and the surface roughness Ra of the upper electrode was as great as 3.5 nm, so that it was determined that islands had been formed. Therefore, the evaluation was "x" (bad).

In the cases where the UV ozone treatment time was 1 second and 5 seconds, the surface free energy was 33 to 97 mJ/m2, and, in each of the cases, the sheet resistance and the surface roughness Ra of the upper electrode were both in allowable ranges, and adhesion of foreign matter was not observed. Therefore, the evaluation was "○" (good).

However, when the UV ozone treatment time was set to 10 seconds, the surface free energy became as high as 150 mJ/m2, and, although the sheet resistance and the surface roughness Ra of the upper electrode were both in allowable ranges, adhesion of foreign matter onto the surface of the electron transport layer was observed. Consequently, the evaluation was "x" (bad).

(Summary)

From the above experimental results, it is seen that where the film thickness of the upper electrode 19 is in the range of 10 to 20 nm, if the surface free energy of the electron transport layer as a ground layer for the upper electrode is 33 to 97 mJ/m2 (this condition will hereinafter referred to as "surface free energy condition"), forces for restraining the moving amount of silver atoms are generated, formation of islands is thereby restricted, silver can be formed into a continuous film, and adhesion of foreign matter can be precluded, resulting in that a homogeneous upper electrode can be formed.

Note that in the present embodiment, in place of the configuration in which the electron transport layer is formed with a surface roughness Ra of 0.5 nm as depicted in FIG. 11A and step S11 in FIG. 12 in the first embodiment, a configuration is adopted in which after the formation of the electron transport layer, the UV ozone treatment is conducted for a time of, for example, 2 seconds so as thereby to control the surface free energy of the electron transport layer to 56 mJ/m2.

Other points of configuration are quite the same as those in the first embodiment, and, therefore, descriptions thereof are omitted.

<Modifications>

While the present disclosure has been described based on the embodiments above, the disclosure is naturally not limited to the above embodiments, and the following modifications can be contemplated.

1. Another Method of Controlling Surface Roughness Ra

In the first embodiment above, the surface roughness Ra of the electron transport layer 18 satisfied the surface roughness condition, and, accordingly, the film forming rate was controlled. However, it is also possible to control the surface roughness Ra by regulating the temperature of the substrate, with the film forming rate kept constant.

FIG. 17 is a table depicting the experiment example.

As depicted in the table, when the substrate temperature was varied from 25° C. to 300° C. with the film forming rate kept constant at 1.5 Å/s, the followings were found (1) As the substrate temperature at the time of film formation for forming the electron transport layer is raised, the surface roughness Ra of the electron transport layer decreases.

(2) As the surface roughness Ra of the electron transport layer decreases, the silver thin film is liable to be formed into an island form due to nucleus formation, whereby sheet resistance is increased.

(3) When the surface roughness Ra of the electron transport layer decreases and the silver thin film is formed into an island form, the surface roughness of the silver thin film increases.

In the experimental results depicted in FIG. 17, when the substrate temperature was 300° C., the surface roughness Ra of the electron transport layer was 0.2 nm. Besides, in this instance, the sheet resistance and the surface roughness Ra of the silver thin film were both high. Therefore, the evaluation was "x" (bad). When the substrate temperature was 25° C., 80° C., and 150° C., the sheet resistance and the surface roughness Ra of the upper electrode 19 were both in allowable ranges, so that the evaluation was "○" (good).

2. Electron Injection Layer

Figure 18:
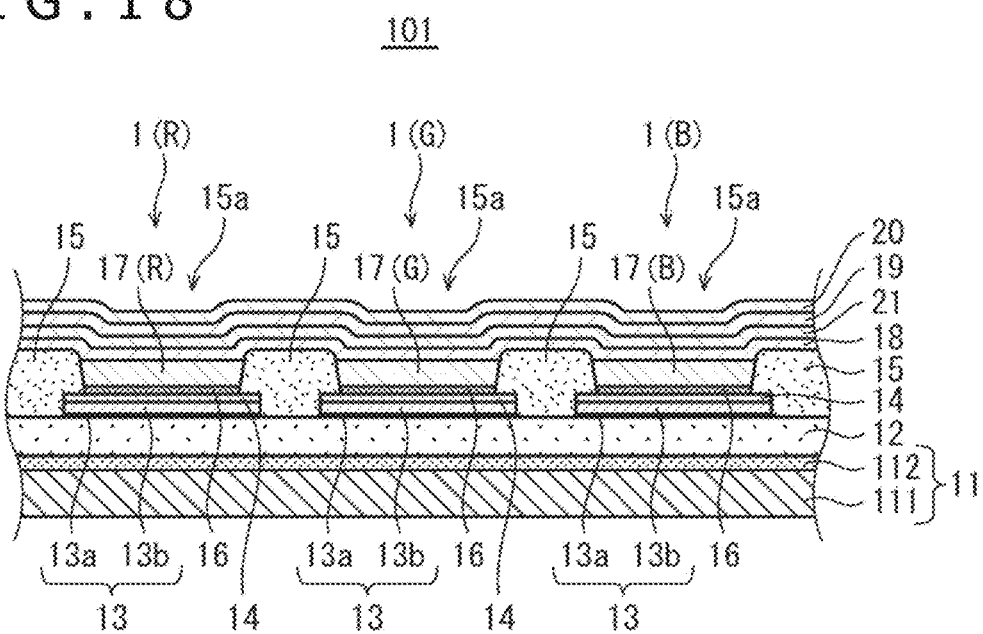
FIG. 18 is a sectional view schematically depicting the configuration of an organic EL element according to a modification.

While an electron injection layer has not been formed in the above embodiments, an electron injection layer 21 may be interposed between the electron transport layer 18 and the upper electrode 19, as illustrated in FIG. 18.

The electron injection layer 21 is formed on the electron transport layer 18 in common to a plurality of pixels, and has a function of promoting the injection of electrons from the upper electrode 19 into the light emitting layers 17.

The electron injection layer 21 is formed on the electron transport layer 18 by use of, for example, a low-work-function metal such as lithium, barium, calcium, potassium, cesium, sodium, and rubidium, a low-work-function metallic salt such as lithium fluoride, a low-work-function metallic oxide such as barium oxide, or the like.

In this case, the electron injection layer 21 serves as a ground layer for the upper electrode 19, and, therefore, the electron injection layer 21 is formed in such a manner that its surface (the surface on which the upper electrode 19 is to be stacked) satisfies the above-mentioned surface roughness condition or surface free energy condition.

3. Optical Resonator Structure

Figure 19:
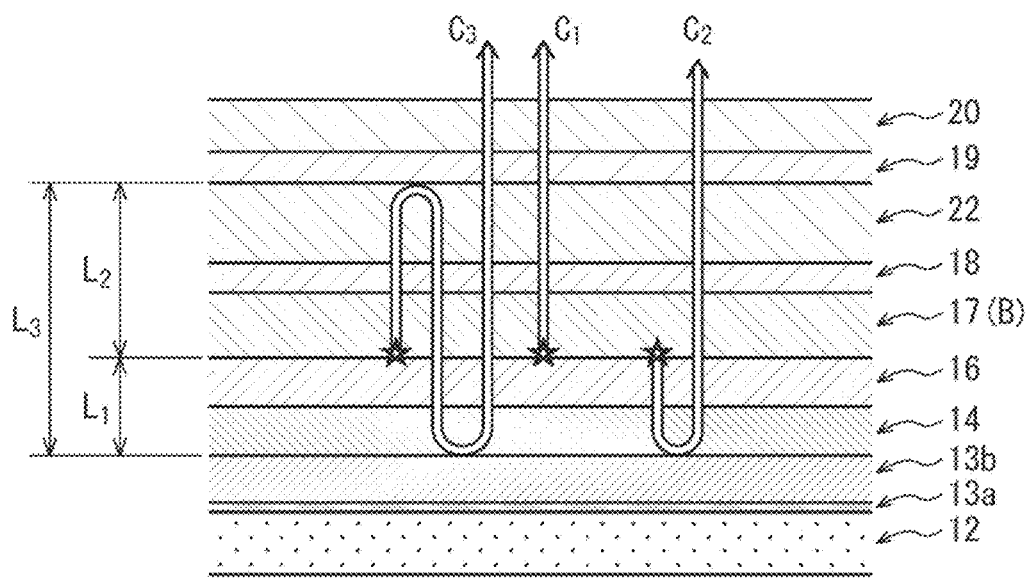
FIG. 19 is a partial sectional view schematically depicting an optical resonator structure of the organic EL display element according to the modification.

As illustrated in a schematic partial enlarged sectional view of an EL element in FIG. 19, a light-transmitting electrically conductive layer 22 which is common to a plurality of pixels may be interposed between the electron transport layer 18 and the upper electrode 19.

The light-transmitting electrically conductive layer 22 is provided for forming an optical resonator structure that has an upper surface of the lower electrode 13 and a lower surface of the upper electrode 19 as reflective surfaces. For this reason, the light-transmitting electrically conductive layer 22 is preferably formed from a metallic oxide which has a high visible light transmittance and has a refractive index different from that of the upper electrode 19 composed of a silver thin film; for example, ITO and IZO can be used.

The light-transmitting electrically conductive layer 22 has a film thickness which is controlled for providing an optical resonator structure on the inside of the interface between the upper electrode 19 and the light-transmitting electrically conductive layer 22 and the interface between the lower electrode 13 and the hole injection layer 14, the interfaces serving as reflective surfaces of the optical resonator structure.

FIG. 19 depicts main routes of light emitted from the light emitting layer 17. Route C1 is a route along which the light emitted from the light emitting layer 17 to the upper electrode 19 side is transmitted through the upper electrode 19 without being reflected. Route C2 is a route along which the light emitted from the light emitting layer 17 to the lower electrode 13 side is reflected by the lower electrode 13 and is then transmitted through the light emitting layer 17 and the upper electrode 19. Route C3 is a route along which the light emitted from the light emitting layer 17 to the upper electrode 19 side is reflected by the upper electrode 19, is further reflected by the lower electrode 13, and is transmitted through the light emitting layer 17 and the upper electrode 19. Then, interference occurs between the lights emitted and transmitted along the routes C1 to C3. The difference in optical distance between the route C2 and the route C3 corresponds to an optical film thickness L2 depicted in FIG. 19. In addition, the difference in optical distance between the route C1 and the route C3 corresponds to an optical film thickness L3 depicted in FIG. 19. The light-transmitting electrically conductive layer 22 has a film thickness for setting the optical film thickness L2 and the optical film thickness L3 to desired values for forming the optical resonator structure.

In the present modification, the light-transmitting electrically conductive layer 22 serves as a ground layer for the upper electrode 19; therefore, it is sufficient to set the surface of the light-transmitting electrically conductive layer 22 to satisfy the above-mentioned surface roughness condition or surface free energy condition. By such a setting, a silver-made upper electrode 19 having uniform film properties can be formed.

4. While the upper electrode 19 has been formed from silver alone in the above embodiments, the upper electrode 19 may be formed from a silver alloy containing silver as a main constituent and containing other metal (e.g., copper). In this case, also, so long as silver is used as a main constituent of the upper electrode 19, experimental results similar to those depicted in FIGS. 4 and 14 and the like can be obtained under the above-mentioned surface roughness condition or surface free energy condition.

Note that the upper electrode 19 can also be formed by using gold (Au), copper (Cu), aluminum (Al), magnesium (Mg) or the like in place of silver.

5. While a configuration in which the hole injection layer 14, the hole transport layer 16, the light emitting layer 17, and the electron transport layer 18 are present between the lower electrode 13 and the upper electrode 19 has been adopted in the above embodiments, the present disclosure is not limited to this configuration. For example, a configuration may be adopted in which the hole injection layer 14, the hole transport layer 16 and the electron transport layer 18 are not used, and only the light emitting layer 17 and the ground layer for the upper electrode 19 are present between the lower electrode 13 and the upper electrode 19.

The ground layer in this case need only be an organic layer which has a light-transmitting property and an electrically conductive property. In addition, a metallic oxide such as ITO and IZO may also be used.

Note that the light-transmitting property of the ground layer is desirably a visible light transmittance of not less than 50%, and the electrically conductive property of the ground layer is desirably a sheet resistance of not more than 10 Ω/□.

6. While the organic EL display panel according to the present disclosure has used organic light emitting materials in the above embodiments, this is not restrictive, and the organic EL display panel may use inorganic light emitting materials.

Besides, the display device is not restrictive, and a panel-type illumination device such as an organic EL illumination device may also be provided.

7. While the organic EL display panel and the organic EL display device according to the present disclosure have been described above based on the embodiments and modifications, the present disclosure is not limited to the above-described embodiments and modifications. Modes obtained by applying various modifications conceived by those skilled in the art to the above-described embodiments and modifications, and modes realized by arbitrarily combining the constituent elements and functions included in the above embodiments and modifications within the scope of the gist of the present disclosure are also embraced in the present disclosure.

The present disclosure is suitable for application as an organic EL display panel including an electrode layer which is light-transmitting and low in sheet resistance.

It should be understood by those skilled in the art that various modifications, combinations, sub-combinations and alterations may occur depending on design requirements and other factors insofar as they are within the scope of the appended claims or the equivalents thereof.

What is claimed is:

1. An organic EL element, comprising:
a first electrode, a light emitting layer, a ground layer, and a light-transmitting second electrode stacked in this order over a substrate, wherein
the ground layer is light-transmitting and electrically conductive, and its surface on which the light-transmitting second electrode is stacked has a surface roughness of 0.3 to 2.7 nm, and
the light-transmitting second electrode is a silver thin film layer formed of silver or containing silver as a main constituent.

2. The organic EL element according to claim 1, wherein a thickness of the silver thin film layer is 10 to 20 nm.

3. The organic EL element according to claim 1, wherein the ground layer is an organic layer.

4. The organic EL element according to claim 1, wherein the light-transmitting second electrode is a cathode, and the ground layer is an electron injection layer or an electron transport layer.

5. The organic EL element according to claim 1, wherein a material for the ground layer is selected from indium tin oxide and indium zinc oxide.

6. The organic EL element according to claim 5, wherein a region surrounded by a surface on a light emitting layer side of the first electrode and an interface between the ground layer and the light-transmitting second electrode constitutes an optical resonator having the surface and the interface as reflective surfaces.

7. An organic EL element, comprising:
a first electrode, a light emitting layer, a ground layer, and a light-transmitting second electrode stacked in this order over a substrate, wherein
the ground layer is light-transmitting and electrically conductive, and its surface on which the light-transmitting second electrode is stacked has a surface free energy of 33 to 97 mJ/m$^2$, and
the light-transmitting second electrode is a silver thin film layer formed of silver or containing silver as a main constituent.

8. The organic EL element according to claim 7, wherein a thickness of the silver thin film layer is 10 to 20 nm.

9. The organic EL element according to claim 7, wherein the ground layer is an organic layer.

10. The organic EL element according to claim 7, wherein the light-transmitting second electrode is a cathode, and the ground layer is an electron injection layer or an electron transport layer.

11. The organic EL element according to claim 7, wherein a material for the ground layer is selected from indium tin oxide and indium zinc oxide.

12. The organic EL element according to claim 11, wherein a region surrounded by a surface on a light emitting layer side of the first electrode and an interface between the ground layer and the light-transmitting second electrode constitutes an optical resonator having the surface and the interface as reflective surfaces.

13. An organic EL display panel, comprising:
an organic EL element including:
a first electrode, a light emitting layer, a ground layer, and a light-transmitting second electrode stacked in this order over a substrate,
wherein the ground layer is light-transmitting and electrically conductive, and its surface on which the light-transmitting second electrode is stacked has a surface roughness of 0.3 to 2.7 nm, and
the light-transmitting second electrode is a silver thin film layer formed of silver or containing silver as a main constituent.

14. An organic EL display panel, comprising:
an organic EL element including
a first electrode, a light emitting layer, a ground layer, and a light-transmitting second electrode stacked in this order over a substrate,
wherein the ground layer is light-transmitting and electrically conductive, and its surface on which the light-transmitting second electrode is stacked has a surface free energy of 33 to 97 mJ/m$^2$, and
the light-transmitting second electrode is a silver thin film layer formed of silver or containing silver as a main constituent.

15. A method of manufacturing an organic EL display panel, the method comprising:
stacking a first electrode, a light emitting layer, a ground layer, and a light-transmitting second electrode in this order over a substrate,
wherein the ground layer is formed from a light-transmitting and electrically conductive material, and its surface on which the light-transmitting second electrode is stacked has a surface roughness of 0.3 to 2.7 nm, and
the light-transmitting second electrode includes a silver thin film layer formed of silver or containing silver as a main constituent.

16. The method of manufacturing the organic EL display panel according to claim 15, wherein a film thickness of the silver thin film layer is 10 to 20 nm.

17. A method of manufacturing an organic EL display panel, the method comprising:
stacking a first electrode, a light emitting layer, a ground layer, and a light-transmitting second electrode in this order over a substrate,
wherein the ground layer is formed from a light-transmitting and electrically conductive material, and its surface on which the light-transmitting second electrode is stacked has a surface free energy of 33 to 97 mJ/m$^2$, and
the light-transmitting second electrode includes a silver thin film layer formed of silver or containing silver as a main constituent.

18. The method of manufacturing the organic EL display panel according to claim 17, wherein a film thickness of the silver thin film layer is 10 to 20 nm.

* * * * *